United States Patent
Zhou et al.

(10) Patent No.: US 10,550,463 B2
(45) Date of Patent: Feb. 4, 2020

(54) METHOD FOR MANUFACTURING ANTENNA AND MOBILE DEVICE

(71) Applicant: AAC Technologies Pte. Ltd., Singapore (SG)

(72) Inventors: Liyi Zhou, Shenzhen (CN); Xiaolong Zhu, Shenzhen (CN); Jian Yang, Shenzhen (CN); Xihua Cao, Shenzhen (CN); Jiandui Wang, Shenzhen (CN); Ying Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/102,091

(22) Filed: Aug. 13, 2018

(65) Prior Publication Data
US 2019/0153583 A1  May 23, 2019

(30) Foreign Application Priority Data

Nov. 17, 2017 (CN) .......................... 2017 1 1143553

(51) Int. Cl.
| | | |
|---|---|---|
| *C25D 7/00* | (2006.01) | |
| *C23C 14/02* | (2006.01) | |
| *H01Q 1/38* | (2006.01) | |
| *C23C 14/54* | (2006.01) | |
| *H01Q 1/24* | (2006.01) | |
| *H01Q 9/04* | (2006.01) | |
| *H01Q 1/40* | (2006.01) | |

(52) U.S. Cl.
CPC .......... *C23C 14/025* (2013.01); *C23C 14/542* (2013.01); *H01Q 1/242* (2013.01); *H01Q 1/243* (2013.01); *H01Q 1/38* (2013.01); *H01Q 1/40* (2013.01); *H01Q 9/0407* (2013.01)

(58) Field of Classification Search
CPC ............................. C23C 14/025; H01Q 1/242
USPC ......................................................... 343/904
See application file for complete search history.

(56) References Cited

U.S. PATENT DOCUMENTS

| | | | |
|---|---|---|---|
| 2008/0052904 A1* | 3/2008 | Schneider | H01L 21/486 29/846 |
| 2013/0082895 A1* | 4/2013 | Shiu | C25D 7/00 343/866 |

* cited by examiner

*Primary Examiner* — Peguy Jean Pierre
(74) *Attorney, Agent, or Firm* — IPro, PLLC; Na Xu (57) ABSTRACT

The present disclosure relates to the technical field of mobile communication, and particularly to a method for manufacturing an antenna, and further relates to a mobile device. The manufacturing method provided comprises: S1: forming a paint coating on a surface of a ceramic back shell; S2: forming a concave area on the paint coating; and S3: forming the antenna in the concave area. The antenna manufactured by using the method for manufacturing an antenna provided by the present disclosure is difficult to bend, and is difficult to come into untight attachment with a back shell of a mobile phone, which can make the antenna occupy an installation space in the mobile device as little as possible.

10 Claims, 5 Drawing Sheets

METHOD FOR MANUFACTURING ANTENNA AND MOBILE DEVICE

CROSS-REFERENCE TO RELATED APPLICATIONS

This application claims the priority benefit of Chinese Patent Applications Ser. No. 201711143553.2 filed on Nov. 17, 2017, the entire content of which is incorporated herein by reference.

FIELD OF THE PRESENT DISCLOSURE

The present disclosure relates to the technical field of mobile communication, and more particularly, to a method for manufacturing an antenna, and further relates to a mobile device.

DESCRIPTION OF RELATED ART

With the development of science and technology, a back shell material of a mobile phone has become more and more diversified. Since ceramic has the performances of not interfering or weakening electromagnetic signals, mobile phone signals can be avoided from shielding under a 5G circumstance, and a wireless charging technology for mobile phones becomes possible. In the meanwhile, transparent ceramic such as alumina ceramic has been successfully developed, which means that a back shell of a mobile phone made of a transparent ceramic material can also acquire higher image sharpness by matching with an OLED screen. Therefore, in next few years, the ceramic back shell is expected to become a standard configuration for the back shell of the mobile phone.

According to conventional antenna design solutions, such as FPC antenna design and LDS antenna design applied to the mobile phone, the antenna is attached along an edge of the plastic back shell of the mobile phone or directly manufactured in the plastic back shell of the mobile phone. Because the anti-deformation abilities of the FPC antenna and the plastic back shell of the mobile phone are both poor, the FPC antenna and the plastic back shell of the mobile phone are easily deformed. Meanwhile, since the antenna is attached to the edge of the back shell of the mobile phone in a non-planar way, the attachment accuracy between the antenna and the plastic back shell of the mobile phone is relatively low, so that the antenna is easily bent, and untight attachment is easy to occur between the antenna and the plastic back shell of the mobile phone, which causes that the antenna can occupy more installation space in the mobile phone, thereby affecting the installation of other components in the mobile phone.

SUMMARY

The present disclosure provides a method for manufacturing an antenna and a mobile device, and the antenna manufactured by the present disclosure occupies a smaller installation space in the mobile device.

A first aspect of the present disclosure provides a method for manufacturing an antenna, wherein the antenna is applied in a mobile device, and the mobile device comprises a ceramic back shell. The manufacturing method comprises the following steps of:

S1: forming a paint coating on a surface of the ceramic back shell;

S2: forming a concave area on the paint coating; and

S3: forming the antenna in the concave area.

Preferably, before S1, the manufacturing method further comprises:

implementing PVD plating on the surface of the ceramic back shell to form a plated surface; and S1 specifically comprises:

forming the paint coating on the surface of the plated surface.

Preferably, the ceramic back shell has an inner surface and an outer surface which are opposite, and S1 specifically comprises:

forming the paint coating on the inner surface.

Preferably, a depth of the concave area is less than a thickness of the paint coating.

Preferably, the paint coating contains metal active particles, and the antenna comprises a metal copper layer, S2 specifically comprises:

forming the concave area on the paint coating by laser radiation, and exposing the metal active particles on the surface of the concave area; and S3 comprises:

forming the metal copper layer on the concave area by palladium-free activation electroless plating.

Preferably, the antenna further comprises a metal nickel layer,

S3 further comprises:

forming the metal nickel layer on the metal copper layer by electroless plating; and passivating an exposed surface of the metal nickel layer.

Optionally, the antenna further comprises a metal nickel layer and a metal gold layer, and S3 further comprises:

forming the metal nickel layer on the metal copper layer by electroless plating; and forming the metal gold layer on the metal nickel layer by electroless plating.

Preferably, before S1, the manufacturing method further comprises:

forming a beautification paint coating on the surface of the ceramic back shell; and before S2, the manufacturing method further comprises forming a spill-proof paint-coated layer on the paint coating.

A second aspect of the present disclosure provides a mobile device, which comprises a ceramic back shell and an antenna manufactured by the manufacturing method according to any one above, wherein the antenna is formed on the ceramic back shell.

Preferably, the antenna comprises a metal copper layer and a metal nickel layer, wherein:

a thickness of the paint coating is 20 to 100 urn; or a depth of the concave area is 10 to 25 um; or a thickness of the metal copper layer is 15 to 50 um; or a thickness of the metal nickel layer is 2 to 8 um.

The technical solution provided by the present disclosure can achieve the following beneficial effects.

The present disclosure provides the method for manufacturing an antenna and the mobile device, and the antenna in the mobile device provided is formed by the manufacturing method provided by the present disclosure. The antenna is directly formed in the concave area of the ceramic back shell of the mobile device, and such an arrangement can prevent untight attachment between the antenna and the back shell of the mobile phone; and meanwhile, the antenna can be substantially avoided from bending, so as to reduce the installation space in the mobile device occupied by the antenna.

It should be understood that, the foregoing general description and the following detailed description are exemplary only, and cannot limit the disclosure.

REFERENCE NUMERALS

1—ceramic back shell;
2—paint coating;
3—antenna; and
4—concave area.

The accompanying drawings are incorporated in the description, constitute a part of the description, illustrate the embodiments consistent with the disclosure, and serve to explain the principles of the disclosure together with the description.

DETAILED DESCRIPTION OF THE EXEMPLARY EMBODIMENTS

The disclosure will be further described in detail hereinafter through specific embodiments and with reference to the accompanying drawings.

Figure 1:
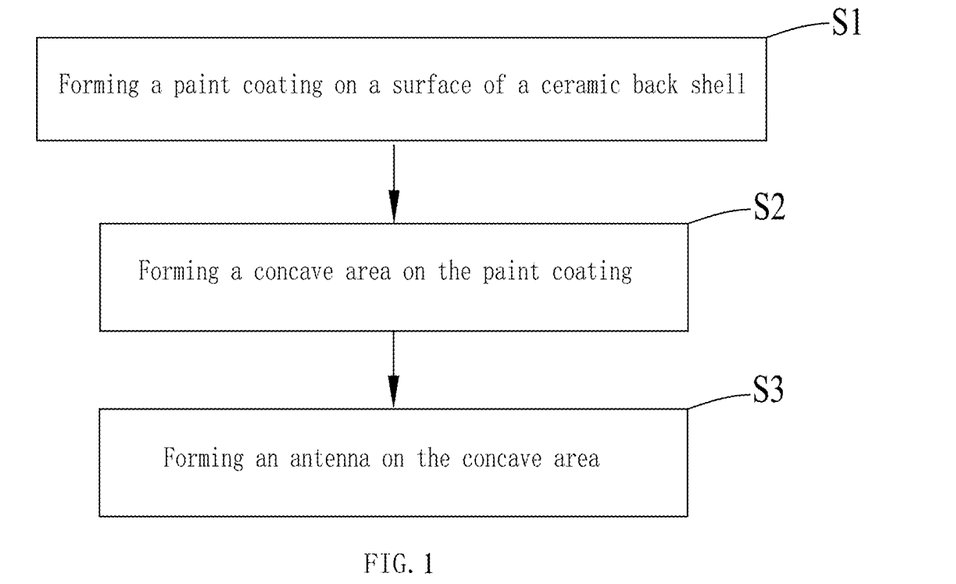
FIG. 1 is a flow chart of a manufacturing method provided by an embodiment of the present disclosure.

Refer to FIG. 1, FIG. 6, FIG. 7 and FIG. 8, wherein FIG. 1 is a flow chart of a method for manufacturing an antenna provided by an embodiment of the present disclosure, which comprises the following steps.

In S1, forming a paint coating 2 on a surface of a ceramic back shell 1.

The ceramic back shell 1 may specifically be a back shell made of a ceramic material in a mobile device, and a suitable ceramic material can be selected according to performance requirements to manufacture a finished product of the ceramic back shell 1; the forgoing ceramic back shell may either be a plane back shell or a curved-surface back shell, and the plane and the curved-surface refer to the shapes of inner and outer surfaces of the ceramic back shell. The staff may set a thickness of the ceramic back shell 1 according to an actual requirement, for example, the thickness of the ceramic back shell 1 may be between 0.3 and 2 min, and the ceramic back shell of this thickness can make an overall thickness of the mobile device relatively small in the case that a certain structural strength is guaranteed, so as to enhance the user experience. The paint coating 2 may be prepared in advance, the paint coating 2 may be a film-like structure formed by a special paint for Laser Direct Structuring (LDS), and the film-like paint coating 2 may be configured on the surface of the ceramic back shell 1 by heating and pressing, so that the paint coating 2 is integrated with the ceramic back shell 1. It should be noted that the thickness of the paint coating 2 may be controlled to be relatively small by setting corresponding parameters of a processing device, thereby increasing a surface tension between the paint coating 2 and the ceramic back shell 1, so that it is more difficult to separate the paint coating 2 from the ceramic back shell 1. Similarly, the surface of the ceramic back shell 1 may be completely covered by the paint coating 2 according to the actual requirement, or the paint coating 2 with a relatively small surface area may be formed only in the area where the antenna 3 needs to be formed, for example, a size of the pre-prepared paint coating 2 can be relatively small, and then the paint coating 2 with a relatively small surface area is attached to the surface of the ceramic back shell 1 by heating and pressing. Certainly, the ceramic back shell 1 with a paint coating 2 may also be directly formed through a feasible processing method during the manufacturing process of the ceramic back shell 1.

In S2, forming a concave area 4 on the paint coating 2.

The concave area 4 may be formed on the paint coating 2 by multiple modes such as engraving, chemical etching and laser etching; and meanwhile, in the process of forming the concave area 4, a shape of the concave area 4 may be changed correspondingly according to the shapes or patterns of different antennas 3, so that the shape of the concave area 4 is adapted to the shape or pattern of the antenna 3 needing to be formed.

In S3, forming the antenna 3 in the concave area 4.

Specifically, the antenna 3 may comprise one or more of various mobile phone PIFA antennas and MONOPOLE antennas, and in comprehensive consideration of cost, radio frequency capability, processing difficulty and other aspects, the antenna 3 may be made of metal. A metal layer with a certain thickness may be formed on the concave area 4 by mechanical plating, electroless plating, or casting, and the forgoing metal layer is the metal antenna 3.

It can be seen from the above that the antenna 3 is directly formed in the concave area 4 on the ceramic back shell 1, and the antenna 3 is directly connected to the concave area 4 during the forming process; and meanwhile, the concave area 4 can also limit the antenna 3 to some extent, which makes the processed antenna 3 difficult to bend, and make the antenna 3 come into tighter attachment with the ceramic back shell 1, so that the antenna 3 occupies a smaller installation space in the mobile device.

Figure 2:
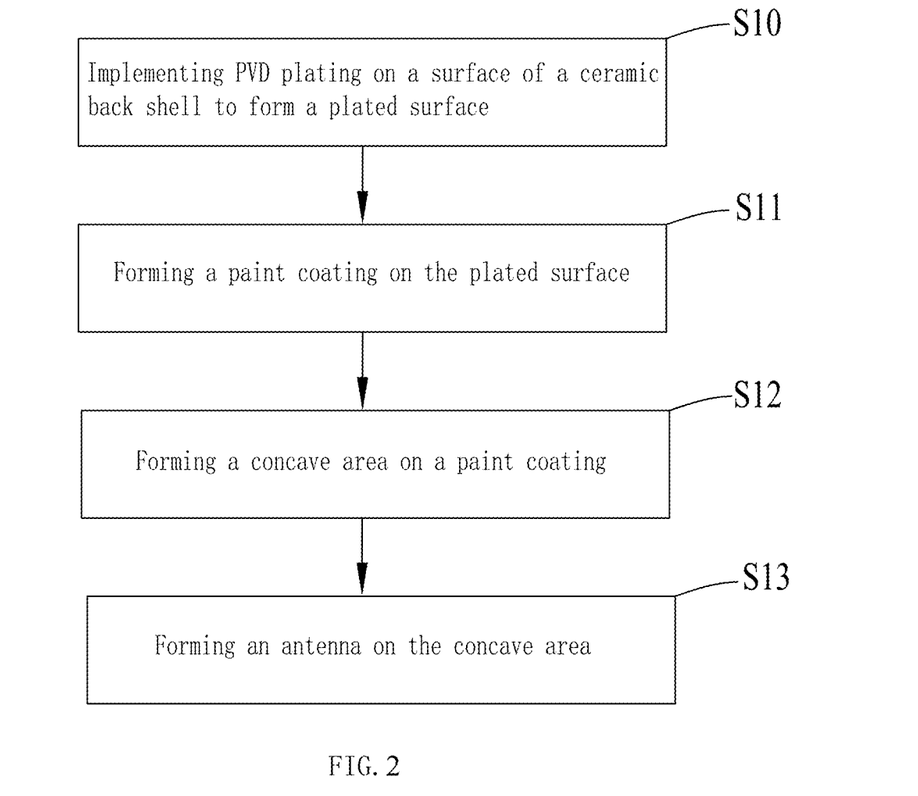
FIG. 2 is another flow chart of the manufacturing method provided by the embodiment of the present disclosure.

Preferably, refer to FIG. 2. FIG. 2 is another flow chart of the manufacturing method provided by the embodiment of the present disclosure. The manufacturing method above may further comprise:

S10: implementing PVD (physical vapor deposition) plating on the surface of the ceramic back shell 1 to form a plated surface; and S1 specifically comprises:

S11: forming the paint coating 2 on the surface of the plated surface.

Specifically, the PVD plating is a processing technology for forming a PVD coating on a surface to be processed by a PVD technology. The PVD coating may be formed on the surface of the ceramic back shell 1 by magnetron cathode arc, filtered cathode arc, or magnetron sputtering. The PVD coating can increase a hardness of the surface of the ceramic back shell 1, so that the ceramic back shell 1 is difficult to break; and meanwhile, the PVD coating can also improve the wear resistance and chemical stability of the surface of the ceramic back shell 1. In addition, the forming process S12 of the concave area 4 and the specific processing S13 of the antenna 3 have been described in detail in the foregoing and will not be elaborated herein.

In order to improve the aesthetic degree of the ceramic back shell 1 while saving the production cost, the paint coating 2 may be formed only on the inner surface of the ceramic back shell 1. Specifically, the inner surface and the outer surface of the ceramic back shell 1 may be two opposite surfaces of the ceramic back shell 1 in a thickness direction thereof, the inner surface is the surface that is enclosed in the mobile device, and the outer surface is another surface exposed to the outside after the mobile device is completely assembled. For example, the paint coating 2 may be only formed on the inner surface of the ceramic back shell 1 by heating and pressing, and the paint coating 2 may only cover a partial area of the inner surface of the ceramic back shell 1, which can greatly save the processing time.

Further, a depth of the concave area 4 may be controlled to be less than a thickness of the paint coating 2, which can avoid the material for manufacturing the antenna 3 from being directly contacted with the ceramic back shell 1 to erode or destroy the ceramic back shell 1 when the depth of the concave area 4 is equal to the thickness of the paint coating 2. The depth of the concave area 4 and the thickness of the paint coating 2 are dimensional values of the two in the thickness direction of the ceramic back shell 1. When processing the concave area 4, relevant parameter values of the processing device may be controlled or changed according to an actual thickness value of the paint coating 2, so that the depth of the formed concave area 4 is smaller than the thickness of the paint coating 2. For example, when the concave area 4 is processed by laser lithography, a laser emitter with a rated power may be controlled to travel on the paint coating 2 at a set speed according to a predetermined track, so as to form the concave area 4 having a depth smaller than the thickness of the paint coating 2. In addition, when the concave area 4 is processed in other ways, those skilled in the art can control the depth of the formed concave area 4 to be smaller than the thickness of the paint coating 2 by a feasible method.

Figure 3:
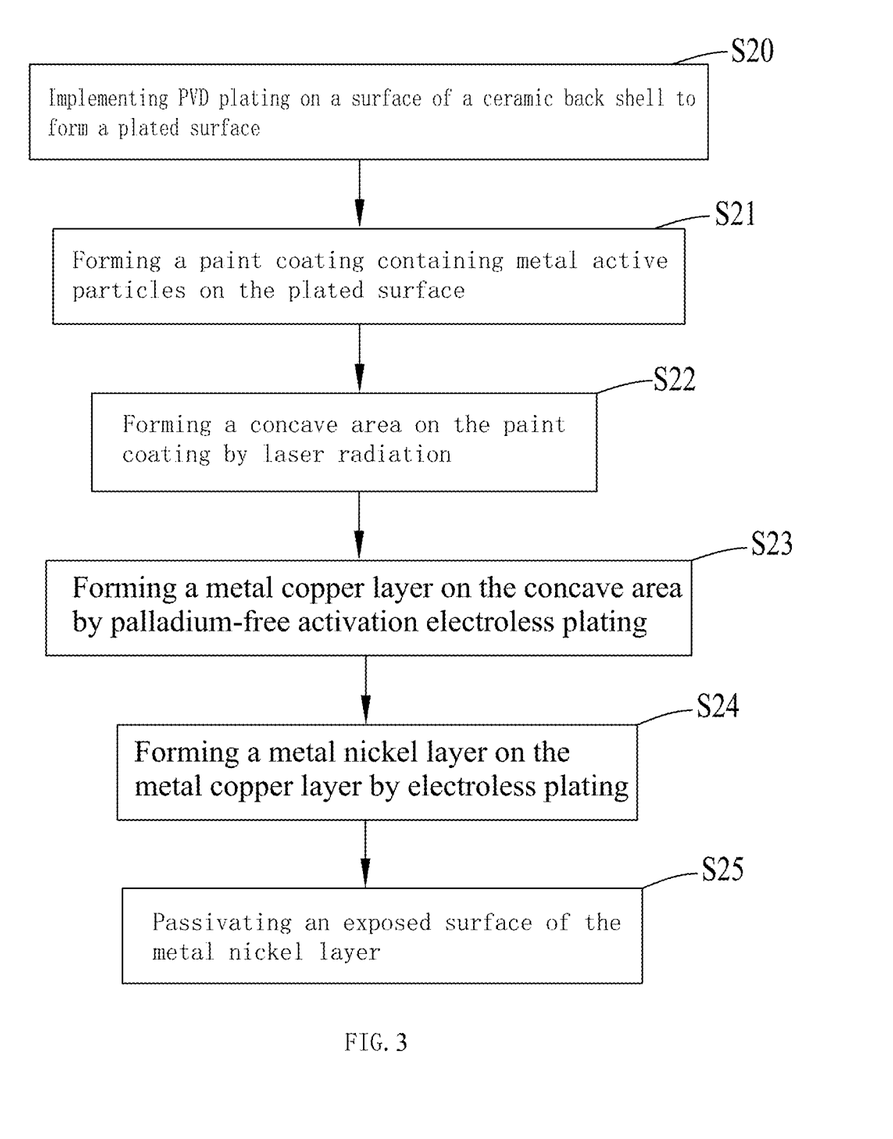
FIG. 3 is another flow chart of the manufacturing method provided by the embodiment of the present disclosure.
Figure 4:
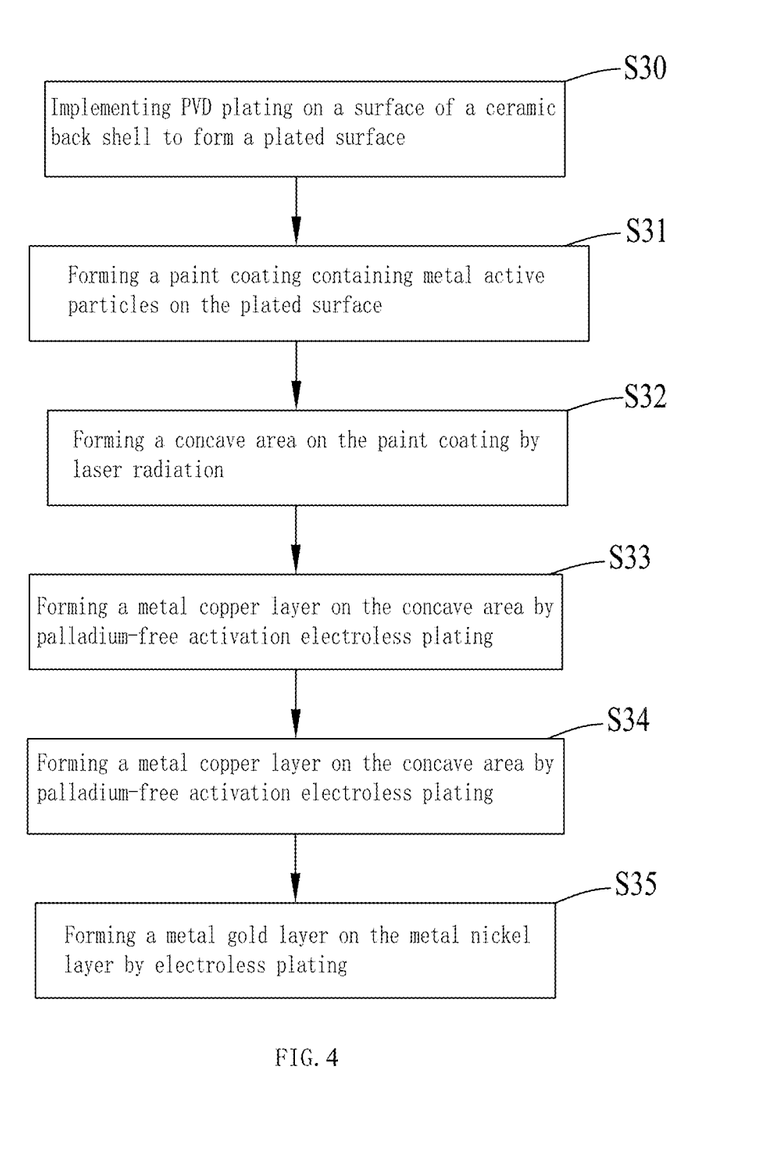
FIG. 4 is another flow chart of the manufacturing method provided by the embodiment of the present disclosure.

Further, as shown in FIG. 3 and FIG. 4, the metal antenna 3 may be formed by LDS. Since most of the working processes can be completed by an automatic device or may be completed by the processing device automatically controlled by computer programs during the working process of manufacturing the metal antenna 3 by LDS, the labor cost can be greatly saved and the production efficiency can be improved.

Specifically, as shown in S21 and S22 in FIG. 3, since the special paint material for LDS is added with a powder substance containing metal active particles, the paint coating 2 in a film-like structure that is evenly mixed with the metal active particles may be formed by using the forgoing paint, and then the paint coating 2 added with the metal active particles is formed on the surface of the ceramic back shell 1 by heating and pressing; or, the special paint for LDS may be directly sprayed and transferred on the surface of the ceramic back shell 1, so as to form the paint coating 2. The powder substance containing the metal active particles in the special paint for LDS may be a metal element, an inorganic compound of metal, or an organic complex of metal; and the type of the metal may be one or more. For example, the metal antenna 3 may be made of metal copper only, then the metal active particles may be one or more of a metal copper element, an inorganic compound of copper and an organic complex of copper. After the paint coating 2 is formed, the concave area 4 may be formed by irradiating the paint coating 2 through an infrared laser or an ultraviolet laser. Those skilled in the art may form the concave area 4 with a set depth by controlling a movement speed of the laser based on the depth of the concave area 4 to be formed, and the type of the paint material used, the power and frequency of the laser, and other fixed parameters. Similarly, the staff may also select a laser with a set specification, so that a light spot formed by a laser beam emitted by the forgoing laser on the paint coating 2 may be a round light spot, and a diameter of the round light spot may be 5 to 150 um, for example, the power of the laser emitter may be 3.5 to 20 W. In addition, the staff may control a movement path of the laser through setting a corresponding program, so that a track formed by the movement of the laser may be in a linear shape or a cross shape, and the concave area 4 with a set size and shape is formed through setting the corresponding program and controlling the movement of the laser. It can be known from the foregoing that the concave area 4 may be formed by laser radiation, and meanwhile, in the movement of the laser, the substance containing the metal active particles in the paint coating 2 may absorb the energy contained in the laser, and is reduced to a metal element. For example, the inorganic compound of copper and the organic complex of copper may be reduced to a metal copper element under the irradiation of laser, and attached to the surface of the concave area 4.

In short, the paint coating 2 may absorb the energy in the laser under the irradiation of the laser, so that partial substance in the paint material is gasified, and the concave area 4 with a certain depth is formed on the paint coating 2. Meanwhile, the substance containing the metal active particles in the paint may also be reduced to the metal element through absorbing the energy in the laser, and attached to the surface of the concave area 4.

Then, as shown in S23 in FIG. 3, a metal copper layer may be formed on the concave area 4 by palladium-free activation electroless plating, and the metal copper layer is the antenna 3. Specifically, the metal copper element attached to the surface of the concave area 4 may be used as a reductive agent for reducing an electroless plating solution. Under the action of a copper element nucleus attached to the surface of the concave area 4, metal copper ions contained in the electroless plating solution may be reduced on the surface of the metal copper nucleus to form the metal copper element which is deposited on the surface of the concave area 4. In the forgoing process, since the metal copper element is always in direct contact with the electroless plating solution, the process of copper plating by electroless plating may be performed continuously until the thickness of the formed metal copper layer meets the use requirement, and the metal copper layer formed in the foregoing deposition process is the antenna 3.

In order to slow down the oxidation rate of the metal copper and improve the radio frequency capability of the antenna, as shown in S24 in FIG. 3, a metal nickel layer may be formed on the surface of the metal copper layer by electroless plating. Specifically, the staff may select a suitable reductive agent to activate the surface of the metal copper layer in advance, and then the ceramic back shell 1 may be immersed in an electroless plating solution containing metal nickel ions, and after plating for a period of time, the metal nickel layer with a certain thickness may be formed on the surface of the metal copper layer. Of course, a certain amount of accelerator may also be added in the electroless plating solution to accelerate the rate of electroless plating, and the accelerator may be a malonic acid solution or a succinic acid solution. Meanwhile, as shown in S25 in FIG. 3, the exposed surface of the metal nickel layer may also be passivated. Specifically, a suitable passivating agent solution may be selected, the passivating agent may be a sulfuric acid solution with a certain concentration, the surface of the metal nickel layer may be passivated by the sulfuric acid solution to form a layer of dense protective film on the surface of the metal nickel layer, so as to delay the oxidation rate of the metal antenna 3 with a metal nickel surface. Similarly, the foregoing method may also comprise S20 of forming a PVD coating by PVD, which will not be elaborated herein.

Optionally, as shown in S35 in FIG. 4, a metal gold layer may also be formed on the surface of the metal nickel layer by electroless plating to further slow down the oxidation rate of the metal antenna and extend the service life thereof. Correspondingly, other processes in the processing method provided by the present disclosure may keep unchanged, i.e., S30, S31, S32, S33 and S34 may be the same as the specific processing of the foregoing embodiments.

Figure 5:
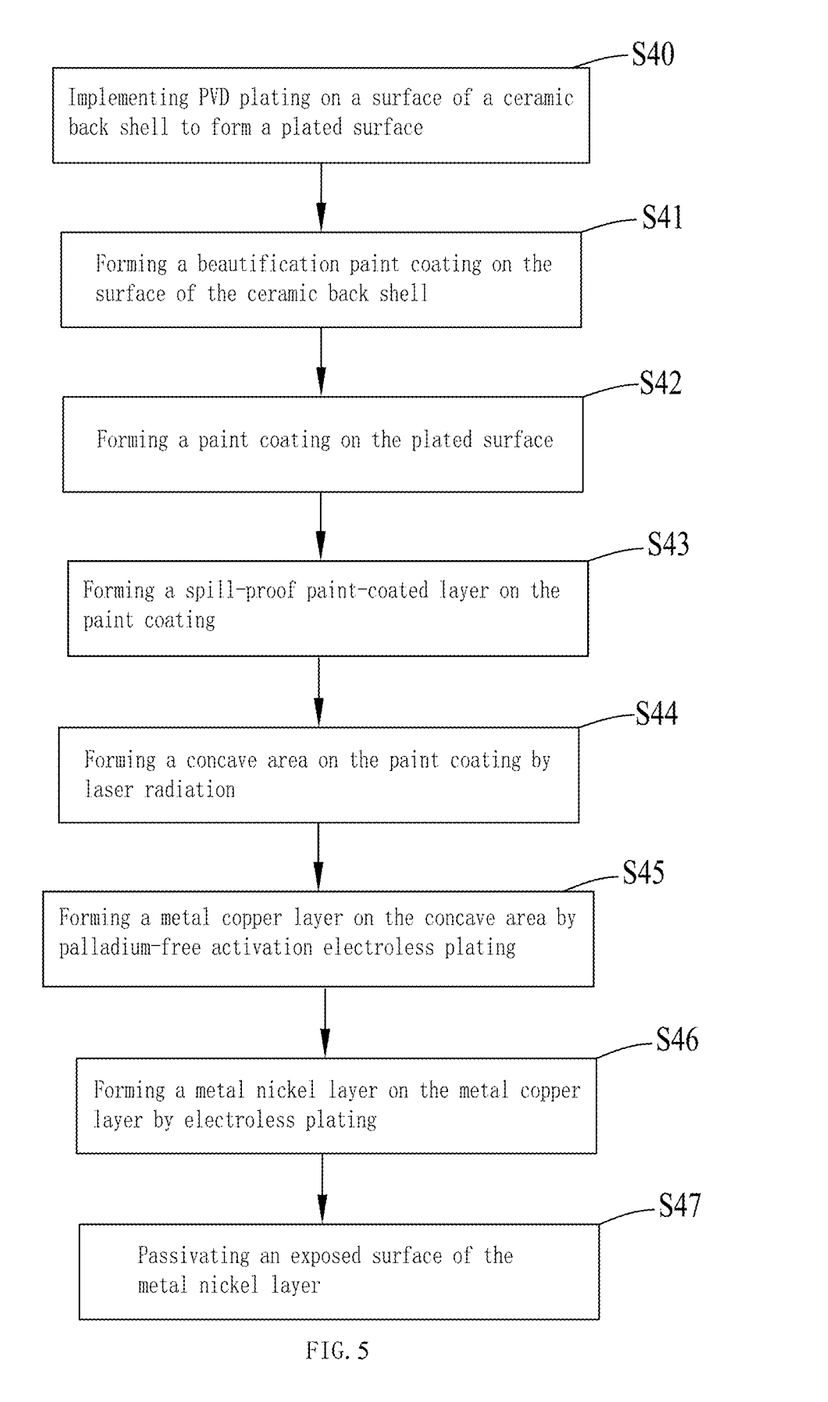
FIG. 5 is another flow chart of the manufacturing method provided by the embodiment of the present disclosure.

In order to make the ceramic back shell show different colors, as shown in FIG. 5, optionally, before S1, the manufacturing method may further comprise the following step.

In S41, forming a beautification paint coating on the surface of the ceramic back shell;

specifically, beautification paints of different colors may be selected according to the user requirements to form a beautification paint coating on the surface of the ceramic back shell through spray coating, transfer printing, screen printing, and other modes, which can improve the user experience.

In order to prevent spill plating in the process of forming the antenna 3 by electroless plating, before S2, the manufacturing method may further comprise the following step.

In S43, forming a spill-proof paint-coated layer on the paint coating. Specifically, those skilled in the art can select the type of the spill-proof paint and the thickness of the pain coating according to the actual requirement. Correspondingly, other processing procedures in the manufacturing method provided by the present application may keep unchanged, i.e., S40, S42, S44, S45, S46 and S47 may be the same as the corresponding processing procedures in the foregoing embodiments.

Figure 6:
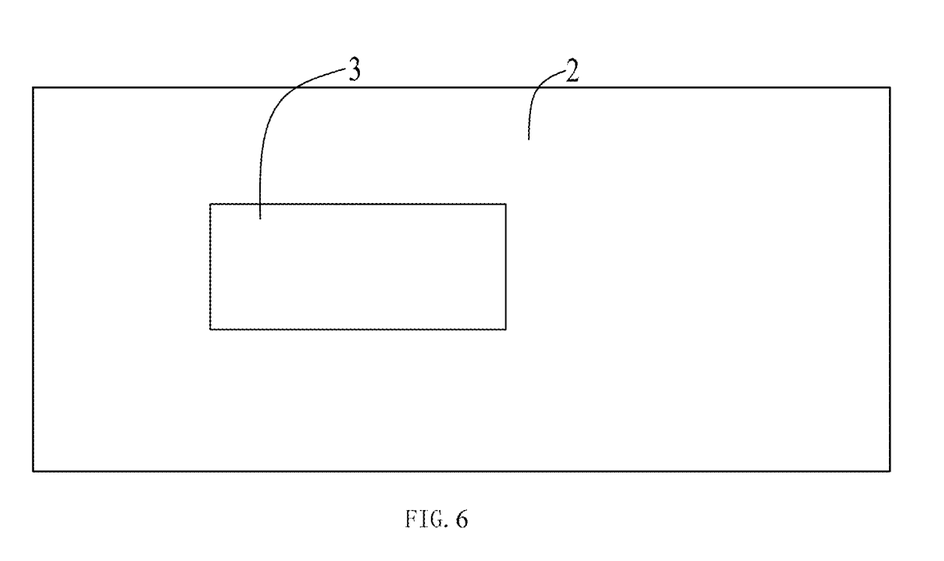
FIG. 6 is a top view illustrating a partial structure of a mobile device provided by the embodiment of the present disclosure.
Figure 7:
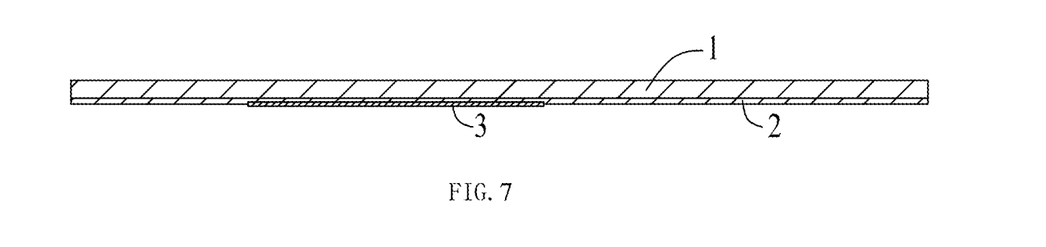
FIG. 7 is a cross-sectional view illustrating the partial structure of the mobile device provided by the embodiment of the present disclosure.
Figure 8:
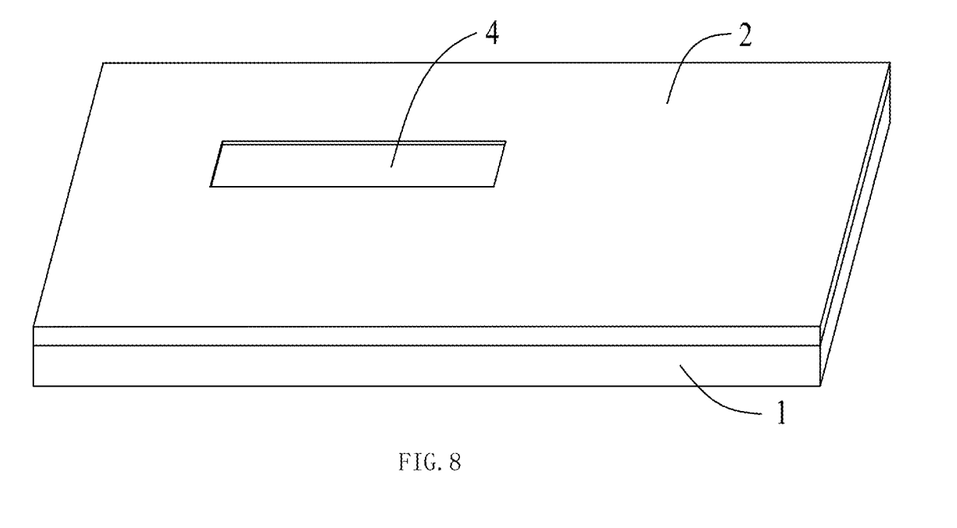
FIG. 8 is a schematic diagram illustrating the partial structure of the mobile device provided by the embodiment of the present disclosure.

Based on the manufacturing method provided by any one of the embodiments above, the embodiment of the present disclosure further provides a mobile device, which, as shown in FIG. 6, FIG. 7 and FIG. 8, comprises a ceramic back shell 1 and an antenna 3 made by the method above, wherein the antenna 3 can be formed on the ceramic back shell 1.

Further, in order to slow down the oxidation rate of the metal antenna 3 and improve the radio frequency capability of the metal antenna 3, the antenna 3 may comprise a metal copper layer and a metal nickel layer, and the metal nickel layer may be completely covered on the metal copper layer. Wherein, the thickness of the paint coating 2 may be controlled between 20 and 100 urn, and the thickness of the paint coating 2 may be as less as possible to save an installation space in the mobile device as much as possible; the depth of the concave area 4 may be set between 10 and 25 um, and the depth of the concave area 4 may be as less as possible from an economical view, so as to reduce a removed amount of the paint coating 2. In order to ensure that the antenna 3 has sufficient strength and the radio frequency capability of the antenna 3 can meet the use requirement, the thickness of the metal copper layer in the antenna 3 may be set between 15 and 50 um, and the thickness of the metal nickel layer may be set between 2 and 8 um.

Optionally, the surface of the nickel layer of the metal antenna may be passivated, or the metal gold layer may be formed on the surface of the nickel layer by electroless plating, so as to further slow down the oxidation rate of the metal antenna.

The antenna 3 formed on the ceramic back shell 1 by the method above can meet the standard requirements in conventional adhesion test, boiling adhesion test, salt spray test, alternating temperature humidity test, high temperature and humidity, temperature shock, constant temperature and humidity, high and low temperature storage, and other tests.

Those described above are merely preferred embodiments of the disclosure, but are not intended to limit the disclosure. To those skilled in the art, the disclosure may have various changes and modifications. Any changes, equivalent substitutions, and improvements made within the spirit and principle of the disclosure shall all fall within the protection scope of the disclosure.

What is claimed is:

1. A method for manufacturing an antenna, the antenna being applied in a mobile device, and the mobile device comprising a ceramic back shell, wherein the method for manufacturing an antenna comprises the following steps of:
   Step1: forming a paint coating on a surface of the ceramic back shell, wherein the paint coating contains metal active particles;
   Step2: forming a concave area on the paint coating by laser radiation, while reducing the metal active particles to metal elements and exposing the metal elements on the surface of the concave area; and
   Step3: forming the antenna in the concave area by palladium-free activation electroless plating, wherein the metal elements are used as a reductive agent.

2. The manufacturing method according to claim 1, wherein before Step1, the manufacturing method further comprises:
   implementing PVD (Physical Vapor Deposition) plating on the surface of the ceramic back shell to form a plated surface; and
   Step1 specifically comprises:
   forming the paint coating on the surface of the plated surface.

3. The manufacturing method according to claim 1, wherein the ceramic back shell has an inner surface and an outer surface which are opposite, and Step1 specifically comprises:
   forming the paint coating on the inner surface.

4. The manufacturing method according to claim 3, wherein a depth of the concave area is less than a thickness of the paint coating.

5. The manufacturing method according to claim 1, wherein the antenna comprises a metal copper layer,
   Step3 comprises:
   forming the metal copper layer on the concave area by palladium-free activation electroless plating.

6. The manufacturing method according to claim 5, wherein the antenna further comprises a metal nickel layer,
   Step3 further comprises:
   forming the metal nickel layer on the metal copper layer by electroless plating; and
   passivating an exposed surface of the metal nickel layer.

7. The manufacturing method according to claim 5, wherein the antenna further comprises a metal nickel layer and a metal gold layer, and Step3 further comprises:
   forming the metal nickel layer on the metal copper layer by electroless plating; and
   forming the metal gold layer on the metal nickel layer by electroless plating.

8. The manufacturing method according to claim 1, wherein before
   Step1, the manufacturing method further comprises:
   forming a beautification paint coating on the surface of the ceramic back shell; and
   before Step2, the manufacturing method further comprises:
   forming a spill-proof paint-coated layer on the paint coating.

9. A mobile device, comprising a ceramic back shell and an antenna manufactured by the manufacturing method according to claim 1, wherein the antenna is formed on the ceramic back shell.

10. The mobile device according to claim 9, the antenna comprising a metal copper layer and a metal nickel layer, wherein:
   a thickness of the paint coating is 20 to 100 um; or
   a depth of the concave area is 10 to 25 um; or
   a thickness of the metal copper layer is 15 to 50 um; or
   a thickness of the metal nickel layer is 2 to 8 um.

* * * * *